(12) United States Patent
Katiyar et al.

(10) Patent No.: US 7,157,144 B1
(45) Date of Patent: Jan. 2, 2007

(54) GIANT REMNANT POLARIZATION IN LASER ABLATED SRBI$_2$NB$_2$O$_9$ THIN FILMS ON PT/TIO$_2$/SIO$_2$/SI SUBSTRATES

(75) Inventors: Ram S. Katiyar, San Juan, PR (US); Pijush Battacharya, San Juan, PR (US); Rasmi R. Das, San Juan, PR (US)

(73) Assignee: University of Puerto Rico, San Juan, PR (US)

( * ) Notice: Subject to any disclaimer, the term of this patent is extended or adjusted under 35 U.S.C. 154(b) by 67 days.

(21) Appl. No.: 11/000,161

(22) Filed: Nov. 30, 2004

(51) Int. Cl.
*B32B 9/00* (2006.01)
*B32B 15/04* (2006.01)

(52) U.S. Cl. ...................... 428/446; 428/469; 428/472; 428/701; 428/702; 427/543; 427/586; 427/596; 427/419.2

(58) Field of Classification Search ...................... None
See application file for complete search history.

(56) References Cited

OTHER PUBLICATIONS

Das, et al., Applied Phys. Lett., 81(9), 1672-1674 (2002).*
Kim, et al., J. Korean Phys. Soc., 45(5), 1275-1278 (2005).*
Yang, et al., J. Mat. Science Letters, 16(22), 1856-1858 (1997).*
Yang, et al., J. Appl. Phys., 93(11), 9226-9230 (2003).*
Ducliere, et al., Appl. Phys. Letters, 81(11), 2067-2069 (2002).*
Gautier et al., Appl. Surface Science, 217, 108-117 (2003).*
Rouede, et al., Optics Communications, 222, 289-297 (2003).*
Das, et al., Ceramics International, 30 (2004) 1175-1179.*
James F. Scott, Carlos A. Paz de Araujo; Ferroelectric Memories; *Science*, vol. 246; 1989; pp. 1400-1405; USA.

P. K. Larsen, G. J. M. Dormans, D. J. Taylor and P. J. van Veldhoven; Ferroelectric properties amd fatigue of PbZr$_{0.51}$Ti$_{0.49}$O$_3$ thin films of varying thickness: Blocking layer model; *J. Appl. Phys.*; 1994; pp. 2405-2413; The Netherlands.
C. A. Paz de Araujo, J. D. Cuchiaro, L. D. McMillan; M. C. Scott and J. F. Scott; Fatigue-free ferroelectric capacitors with platinum electrodes; *Nature*, vol. 374; 1995; pp. 627-629; USA.
Seshu B. Desu and Dilip P. Vijay; Novel fatigue-free lay;ered structure ferroelectric thin films; *Materials Science & Engineering*; 1995; pp. 75-81; USA.
Tze-Chiun Chen, Tingkai Li, Xubai Zhang and Seshu B. Desu; Structure development studies of SrBi$_2$(Ta$_{1-x}$NB$_x$)$_2$O$_9$ thin films; *Journal of Materials Research*; 1997; pp. 2165-2174; USA.

(Continued)

*Primary Examiner*—Jennifer C. McNeil
*Assistant Examiner*—Timothy M. Speer
(74) *Attorney, Agent, or Firm*—Hoglund & Pamias, P.S.C.; Heath W. Hoglund

(57) ABSTRACT

SrBi$_2$Nb$_2$O$_9$ (SBN) thin films are deposited on Pt/TiO2/SiO2/Si substrates using off-axis pulsed laser deposition technique. Off-axis laser ablation avoids plasma damaging of the surface of SBN thin films and is favorable to grow films along the polarization axis (a–b plane). SBN thin films are grown at 350° C. substrate temperature, with 5 mm away from the plasma focus, and annealed at 750° C. for 1 hour in oxygen ambient. These SBN thin films exhibited giant remnant polarization (P$_r$) of 50 μC/cm$^2$ with coercive field of 190 kV/cm. The fatigue endurance of these SBN thin films was measured at 400 kV/cm and showed minimal (<20%) polarization degradation of up to $10^{10}$ switching cycles. The leakage current density of SBN thin films was found to be about $2\times10^7$ up to an applied field of 100 kV/cm. The above-mentioned properties of off-axis deposited SBN thin films, makes it a good material for NVRAM devices.

13 Claims, 5 Drawing Sheets

OTHER PUBLICATIONS

Takehiro Noguchi, Takashi Hase and Yoichi Myasaka; Analysis of the Dependence of Ferroelectric Properties of Strontium Bismuth Tantalate (SBT) Thin Films on the Composition and Process Temperature; *Jpn. J. Appl. Phys.* vol. 35; 1996; pp. 4900-4904; Japan.

Kaoru Miura and Masahiro Tanaka; Difference in the Electronic Structure of $SrBi_2Ta_2O_9$ and $SrBi_2Nb_2O_9$; *Jpn. J. Appl. Phys.*, vol. 37; 1998; pp. 606-607; Japan.

J. Lettieri, M. A. Zurbuchen, Y. Jia, D. G. Schlom, S. K. Streiffer and M. E. Hawley; Epitaxial growth of non-c-oriented $SrBi_2Nb_2O_9$ on (111) $SrTiO_3$; *Applied Physics Letters*; vol. 76, No. 20; 2000; pp. 2937-2939; USA.

Ki Vin Im, Bong Jin Kuh, Soon Oh Park, Sang In Lee and Woong Kil Choo; Influence of $La_{0.5}Sr_{0.5}CoO_3$ Heterosctructure Electrodes on $Pb(Zr,Ti)O3$ Thin Film Properties; *Jpn. J. Appl. Phys.*, vol. 39; 2000; pp. 5437-5440; Korea.

Y. Shimakawa, Y. Kubo, Y. Tauchi, T. Kamiyana, H. Asano and F. Izumi; Structural distortion and ferroelectric properties of $SrBi_2(Ta_{1-x}NB_x)_2O_9$; *Applied Physics Letters*; vol. 77, No. 17; 2000; pp. 2749-2751; Japan.

J. Lettieri, M. A. Zurbuchen, Y. Jia, D. G. Schlom, S. K. Streiffer and M. E. Hawley; Expitaxial growth of $SrBi_2Nb_2O_9$ on (110) $SrTiO_3$ and the establishment of a lower bound on the spontaneous polarization of $6SrBi_2Nb_2O_9$; *Applied Physics Letters*, vol. 77, No. 19; pp. 3090-3092; USA.

Rasmi R. Das, P. Bhattacharya, W. Pérez, Ram S. Katiyar and Seshu B. Desu; Ferroelectric properties of laser-ablated $Sr_{1-x}A_xBi_2Ta_2O_9$ thin films (where A=Ba, Ca); *Applied Physics Letter*, vol. 80, No. 4; 2002; pp. 637-639; USA.

Rasmi R. Das, P. Bhattacharya, W. Pérez and Ram S. Katiyar; High remanent polarization in $Sr_{1-x}Ca_xBi_2Ta_2O_9$ ferroelectric thin films; *Applied Physics Letter*, vol. 81, No. 21; 2002; pp. 4052-4054; USA.

G. Asayama, J. Lettieri, M. A. Zurbuchen, Y. Jia, S. Trolier-McKinstry, D. G. Schlom, S. K. Streiffer; J-P. Maria, S. D. Bu and C. B. Eom; Growth of (103) fiber-textured $SrBi_2Nb_2O_9$ films on Pt-coated silicon; *6Applied Physics Letter*, vol. 80, No. 13; 2002; pp. 2371-2373; USA.

Koji Watanabe, Masahiro Tanaka, Eiko Sumitomo, Kenji Katori, Hajime Yagi and J. F. Scott; Spin-coated ferroelectric $SrBi_2Nb_2O_9$ thin films; Applied Physics Letters, vol. 73, No. 1; 1998; pp. 126-128; USA.

Orlando Auciello, James F. Scott and Ramamoorthy Ramesh; The Physics of Ferroelectric Memories; *Physics Today*; 1998; pp. 22-27; USA.

Kashyap R. Bellur, H. N. Al-Shareef, S. H. Rou, K. D. Gifford, O. Auciello and A. I. Kingon; Electrical Characterization of Sol-Gel Derived PZT Thin Films; Department of Materials Science and Engineering, N. C. State University; 1992; pp. 448-451; USA.

\* cited by examiner

GIANT REMNANT POLARIZATION IN LASER ABLATED SRBI$_2$NB$_2$O$_9$ THIN FILMS ON PT/TIO$_2$/SIO$_2$/SI SUBSTRATES

GOVERNMENT INTERESTS

The claimed invention was made with Government support under grant number INT 0097018 awarded by the National Science Foundation (NSF). The Government has certain rights in this invention.

FIELD OF THE INVENTION

The invention relates to thin films which are suitable for use as memory devices, and more specifically to thin films having a giant remnant polarization.

BACKGROUND OF THE INVENTION

Ferroelectric materials have been widely studied and applied to the application of non-volatile random access memory (NVRAM), particularly over the last decade. Pb(ZrTi)O$_3$ (PZT) has been one of the leading materials, which exhibits a high value of remnant polarization; it also can be fabricated at relatively low crystallization temperatures. Fatigue (defined as loss of polarization with repeated switching of the field) and imprint are the principle factors limiting commercialization of PZT based NVRAMs. Presently, PZT thin films do not show fatigue resistance above $10^6$ switching cycles on mental electrodes such as Pt.

To overcome the problem of fatigue, a number of attempts have been made to fabricate PZT on oxide electrodes (e.g., RuO$_2$, (LaSr)CoO$_3$, LaNiO$_3$, etc.). These have been able to obtain fatigue resistance up to $10^{10}$ switching cycles. This fabrication, however, presents another problem. The integration of oxide electrodes in Si technology complicates the design rules for various commonly-used interconnections.

C. A. Paz de Araujo, et al., *Fatigue-Free Ferroelectric Capacitors with Platinum Electrodes*, Nature, Vol. 374, p. 627 (1995) introduced a new application of so-called Bi-layered compounds, which showed fatigue resistant up to $10^{12}$ switching cycles. Bi-layered compounds were first discovered by B. Aurivillius, *Ark. Kemi*, Vol. 1, p. 463. C. A. Paz de Araujo, et al., studied Aurivillius-layered ferroelectrics, in particular SrBi$_2$Ta$_2$O$_9$ (SBT), in thin film form for its possible application to memory devices because of having a low leakage current density ($\sim 10^{-7}$ A/cm$^2$), low operating voltage, fast switching, and fatigue endurance of up to $10^{12}$ switching cycles. Unfortunately, however, some of the intrinsic fundamental material problems associated with SBT include: (1) a low remnant polarization (P$_r$=10 µC/cm$^2$); (2) a relatively high crystallization temperature ($\sim 750°$ C.); (3) a strong anisotropy characteristics; and (4) fabrication difficulty for thin films on metal electrodes along the polarization axis (a–b plane).

Many attempts have been made to overcome these drawbacks by doping different concentrations of cations at Sr- or Ta-sites, or by growing off-stoichiometric SBT with excess Bi concentration. SrBi$_2$Nb$_2$O$_9$ (SBN) has the same crystal structure with higher curie temperature ($\sim 440°$ C.) than for SBT (335° C.). The displacement of Nb ions inside the octahedral NbO$_6$ is larger than Ta inside TaO$_6$ octahedra, which is expected to show a higher value of remnant polarization. The biaxial strain of SBN is quite small <0.002, and the polarizability of niobate systems is in most cases larger than that of tantalite systems.

K. Watanabe et al., *Spin-coated Ferroelectric SrBi$_2$Nb$_2$O$_9$ Thin Films*, Applied Physics Letters, Vol. 73, No. 1, p. 126 (1998), reported a remnant polarization of 12.5 µC/cm$^2$ in the case of randomly-oriented SBN thin films.

In addition, two reports have studied textured and epitaxial SBN thin films, namely: J. Lettieri, et al., *Epitaxial Growth of SrBi$_2$Nb$_2$O$_9$ on (110) SrTiO$_3$ and the Establishment of a Lower Bound on the Spontaneous Polarization of SrBi$_2$Nb$_2$O$_9$*, Applied Physics Letters, Vol. 77, No. 19, p. 3090 (2000) and J. Lettieri, et al., *Epitaxial Growth of Non-c-oriented SrBi$_2$Nb$_2$O$_9$ on (111) SrTiO$_3$*, Applied Physics Letters, Vol. 76, No. 20, p. 2937 (2000). According to these references, an SBN thin film is able to achieve a remnant polarization of $\sim 11.4$ µC/cm$^2$ on a Pt-coated silicon substrate with a SrRuO$_3$ buffer layer. In addition, a higher remnant polarization of 15.7 µC/cm$^2$ of epitaxial SBN thin films was obtained at an extremely high processing temperature of 877° C. on an oxide SrRuO$_3$/SrTiO$_3$ electrode.

A stable, thin film exhibiting greater remnant polarization is desired. More specifically, a remnant polarization of greater than 25 µC/cm$^2$ is desired without the extremely high processing temperatures required by the prior art.

SUMMARY OF THE INVENTION

Non c-axis oriented SBN thin films on Pt-coated silicon substrate with a giant remnant polarization (P$_r$) of 50 µC/cm2 using pulsed laser deposition (PLD) techniques. Method provides films with higher remnant polarization.

According to one aspect of the invention, a compound especially suitable for use in a memory includes a platinum-coated silicon substrate and a layer of SrBi$_2$Nb$_2$O$_9$ on the platinum-coated silicon substrate. The compound has a maximum remnant polarization of at least 30 µC/cm$^2$. The platinum-coated silicon substrate comprises a Pt/TiO$_2$/SiO$_2$/Si-layered substrate. The layer of SrBi$_2$Nb$_2$O$_9$ is deposited on the platinum-coated silicon substrate by pulsed laser deposition.

According to a more preferred aspect of the invention, the compound has a maximum remnant polarization of at least 40 µC/cm$^2$.

According to a still more preferred aspect of the invention, the compound has a maximum remnant polarization of at least approximately 50 µC/cm$^2$.

According to another aspect of the invention, a thin film having a high remnant polarization is fabricated. A platinum-coated silicon substrate is provided. The platinum-coated silicon substrate is composed of layers of Pt/TiO$_2$/SiO$_2$/Si. A layer of SrBi$_2$Nb$_2$O$_9$ is deposited on the platinum-coated silicon substrate by pulsed laser deposition to form the thin film. The pulsed laser deposition generates a plume having a center axis. The Pt/TiO$_2$/SiO$_2$/Si-layered substrate is positioned off the center axis and is held at constant temperature of approximately 350° C. The thin film is then annealed at approximately 750° C. The thin film has a maximum remnant polarization of at least 30 µC/cm$^2$.

According to a more preferred aspect of the invention, the thin film has a maximum remnant polarization of at least 40 µC/cm$^2$.

According to a still more preferred aspect of the invention, the thin film has a maximum remnant polarization of at least approximately 50 µC/cm$^2$.

BRIEF DESCRIPTION OF THE DRAWINGS

FIG. 2b is a schematic diagram of an $SrBi_2Nb_2O_9$ thin film on the $Pt/TiO_2/SiO_2/Si$ substrate of FIG. 2a.

DETAILED DESCRIPTION OF THE INVENTION

Figure 1:
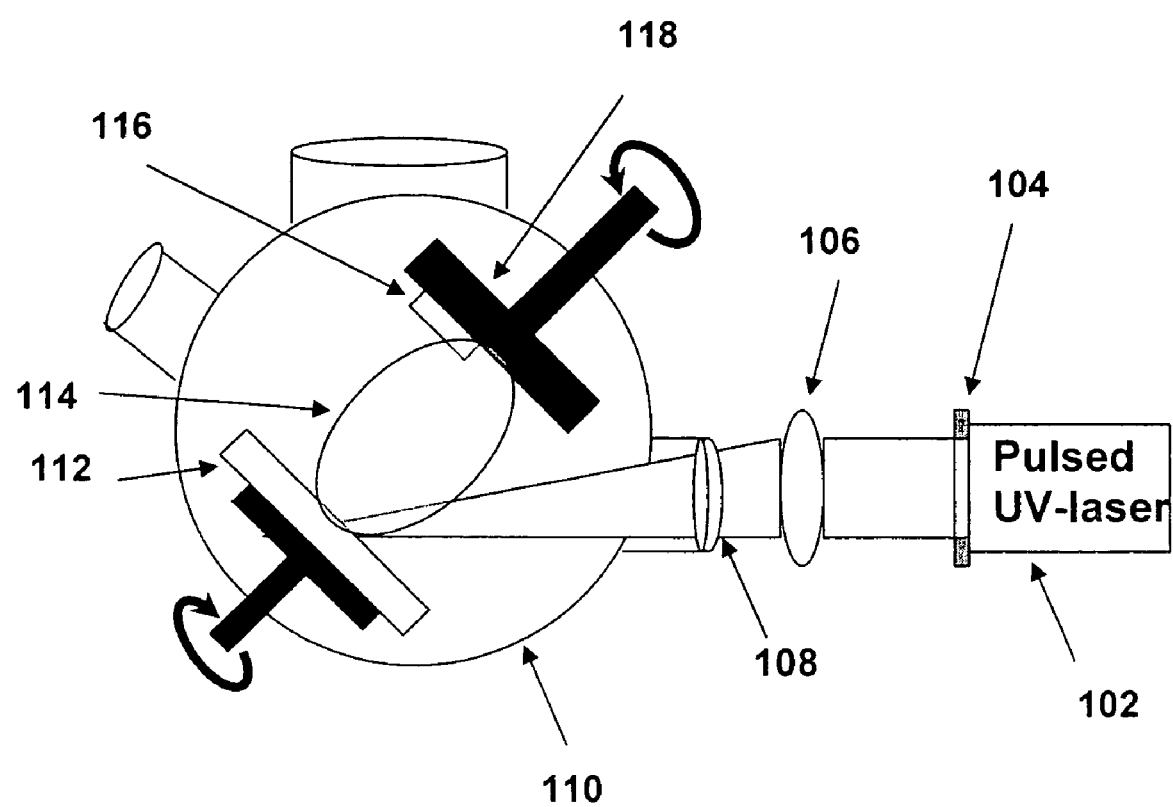
FIG. 1 is a schematic diagram showing one preferred method of depositing $SrBi_2Nb_2O_9$ thin films on $Pt/TiO_2/SiO_2/Si$ substrates.

In accordance with the principles of the invention, one preferred method of fabricating an $SrBi_2NbO_9$ (SBN) thin film is described, with reference to FIG. 1. SBN thin films are deposited on $Pt/TiO_2/SiO_2/Si$ substrates using pulsed-laser deposition. An excimer laser having a KrF beam, with a 248 nm wavelength (manufactured by Lamda Physik, model 210i) is used. The laser beam 102 has an energy density of approximately 1.5 J/cm² and the pulse repetition rate is 10 Hz. The laser beam 102 passes through a mask 104, then through a condensing lens 106 and finally through a quartz window 108 into the deposition chamber 110. The laser beam 102 hits a rotating target 112 to generate a deposition plume 114. The substrate 116 is placed on a rotating heater 118 and is positioned off-axis from the center of the deposition plume 114.

The SBN is deposited until the thin film grows to 550 nm. A densed ceramic target with 15% excess bismuth was prepared by conventional powder processing. The raw powders are wet mixed by ball milling for 10 h, followed by calcinations at 800° C. for 6 hours and sintering at 1050° C. for 4 hours. Thin films were deposited at a constant substrate temperature of 350° C. and post annealed at temperatures of 650, 700 and 750° C.

Figure 2A:
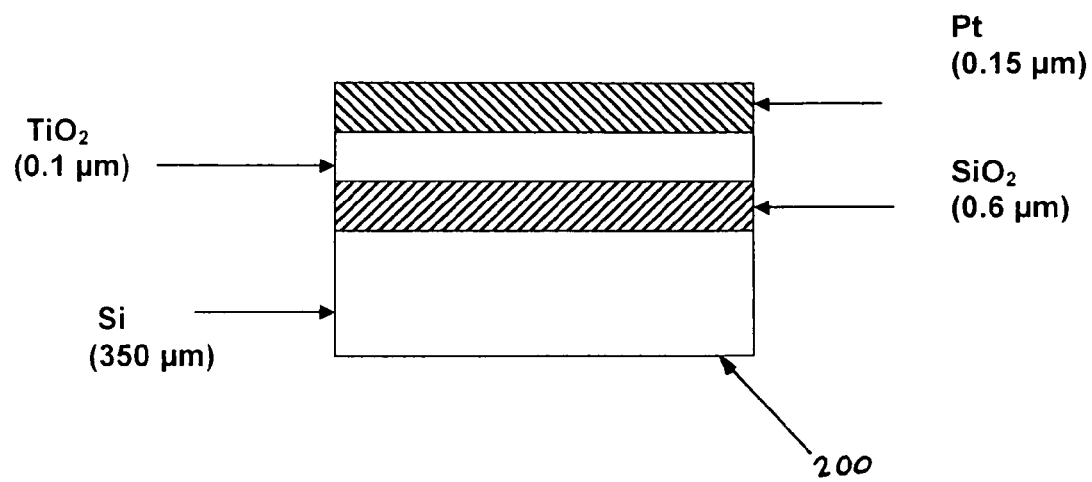
FIG. 2a is a schematic diagram of a $Pt/TiO_2/SiO_2/Si$ substrate.
Figure 2B:
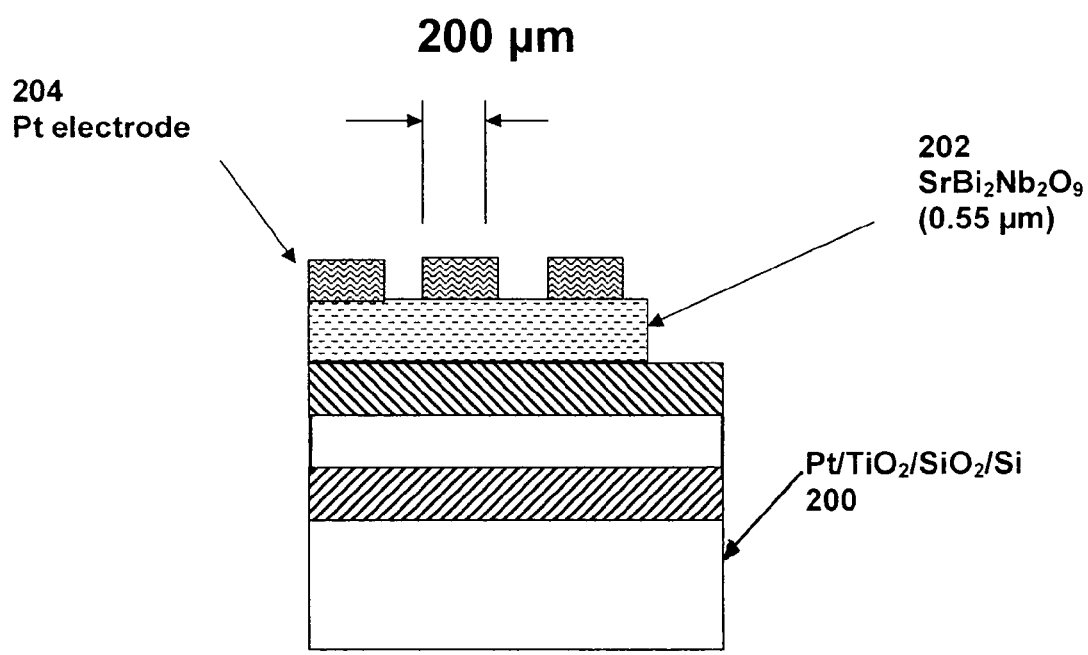

Turning to FIGS. 2a and 2b, a schematic diagram of the target and deposited thin film are shown. The target 200 consists of a layer of Si (approximately 350 µm thick), $SiO_2$ (approximately 0.6 µm thick), $TiO_2$ (approximately 0.1 µm thick) and Pt (approximately 0.15 µm thick). The thin film 202 is deposited on the target 200. As shown it is approximately 0.55 µm thick. Finally, Pt electrodes 204 are placed on the top surface of the thin film 202. These are approximately 200 µm wide.

Thin films prepared in accordance with the above method have been produced and measured to record the diffraction patterns of the thin films and to identify the phase formation and the crystallographic orientations. A Siemens D5000 x-ray diffractometer with CuKα radiation was used. Platinum top electrodes of 200 µm diameter and 200 nm thickness were deposited using dc magnetron sputtering using a DC power source manufactured by Advance Energy, model MDX 500. The ferroelectric properties of the films were measured using a ferroelectric tester manufactured by Radiant Technology, model RT60000HVS, which was operated in the virtual ground mode. Fatigue behavior was examined by applying rectangular pulses at 500 kHz and 400 kV/cm. An electrometer manufactured by Keithley, model 6517 A, was used to study the leakage current characteristics of the films using a staircase, dc-biased voltage of an amplitude ~0.1 V and a delay time of 30 seconds at each voltage step.

Bismuth-layered ferroelectric are strongly anisotropic in nature. The lattice structure of SBN layered compounds have orthorhombic symmetry with a space group of $A2_1am$ at room temperature and transforms to paraelectric tetragonal phase above 440° C., with a space group of I4/mmm. $NbO_6$ octahedras in SBN compounds were arranged along a pseudotetragonal c-axis. The orthorhombic lattice parameters of SBN are a=5.50 Å, b=5.51 Å, and c=25.46 Å. The polarization directions of SBN thin films are along the a–b plane. The dielectric breakdown strength of SBN thin films are higher along the c-axis (non-polar axis) and lower along a or b-axis. The ferroelectric properties of bismuth-layered thin films are primarily influenced by the orientation of the film. Polycrystalline SBN thin films have been grown, which have preferential orientation along c-axis at higher substrate temperature. The depositions of amorphous thin films with typical process parameters enable the suppression of the c-axis orientation.

On-axis deposition SBN thin films were polycrystalline with preferred c-axis orientation. Off-axis SBN thin films exhibited preferred orientation along the a–b plane. It is understood that laser-plasma damage is a major factor, which suppresses a–b plane orientation during on-axis deposition, since along the a–b plane the dielectric breakdown strength is less. Since the dielectric breakdown strength is higher along c-axis, even after plasma damage the orientation is still maintained along c-axis. By avoiding plasma damage during growth of SBN thin films on the substrate, a smooth SBN thin film is deposited which exhibited a large value of remnant polarization.

Figure 3:
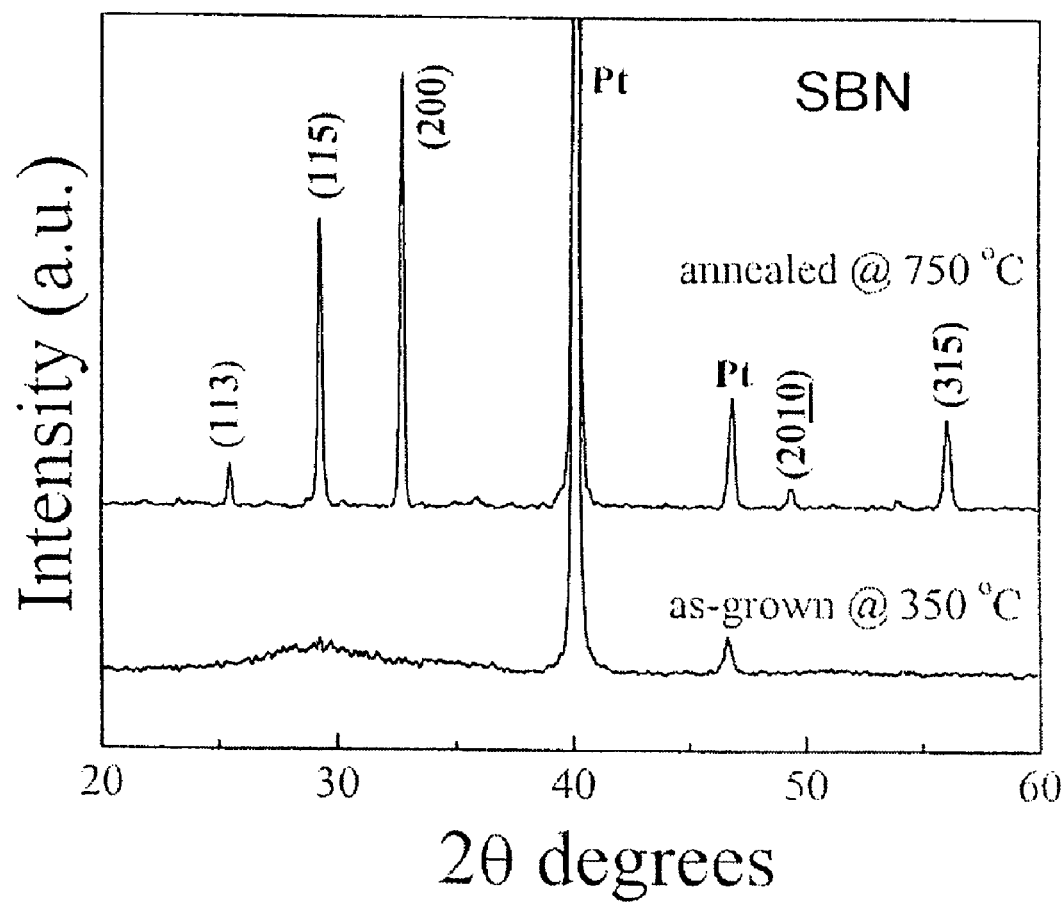
FIG. 3 is a graph of the X-ray diffraction patterns of an SBN thin film grown by one preferred method of fabrication.

X-ray diffraction (XRD) patterns of SBN thin films grown at 350° C. and annealed at 750° C. are depicted in FIG. 3. XRD patterns are indexed by considering the orthorhombic crystal structure at room temperature. The films follow textured characteristics irrespective of the annealing temperature. Presence of intense (200) and (115) diffraction lines revealed that the SBN films are preferentially oriented along polarization plane, that is the a–b plane. With the increase in annealing temperature the diffraction peaks sharpened with a decrease in full width at half maximum, which implies better crystallinity and an increase in crystallite size. There is no evidence of secondary phase formation even after annealing at higher temperature of 750° C.

Figure 4:
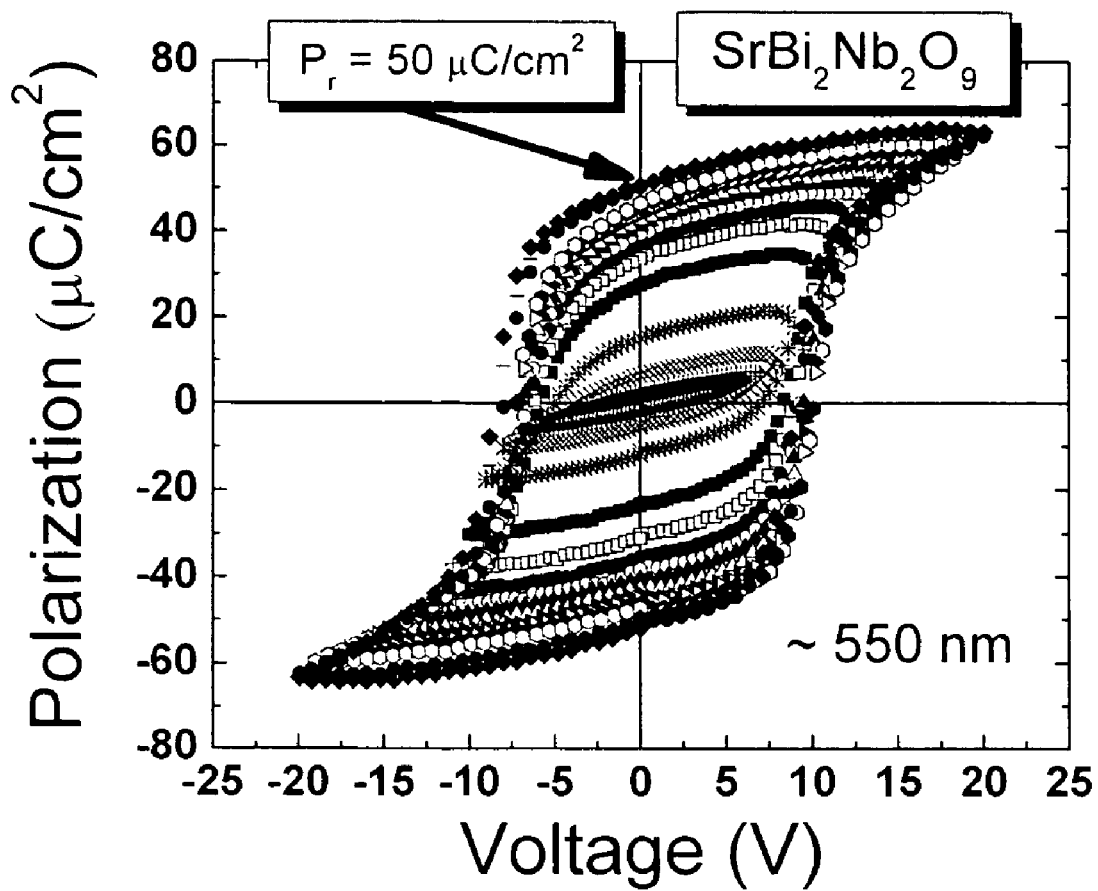
FIG. 4 is a graph of the polarization-field hysteric's loops of the SBN thin film annealed at 750° C.

The polarization field hysteresis characteristics of non c-axis oriented SBN thin films are illustrated in FIG. 4. SBN thin films annealed at a temperature of 750° C. exhibited giant remnant polarization ($P_r$) of 50.7 µC/cm², with coercive field ($E_c$) of 200 kV/cm. The variation of remnant polarization and coercive field with annealing temperature was attributed to the variation in effective grain size. The observed value of remnant polarization is almost double that of previously reported $P_r$ values of SBN, and also 100% higher value than epitaxial (103) SBN thin films grown on $SrRuO_3/SSrTiO_3$ as reported by Lettieri et al. (identified above). Substituting Nb at Ta-site makes the hysteresis loop more square due to better saturation. The bulky hysteresis loop, with higher coercive field in comparison to SBT films has been observed after Nb substitution at Ta-site.

Since the biaxial strain of SBN is less and the polarizablity of SBN is higher than that of SBT, it was expected to show higher polarization values. The general difficulty of obtaining higher polarization on Pt or Pt-coated silicon is overcome by growing off-axis SBN, which showed the desired orientation along the polarization axis.

Figure 5:
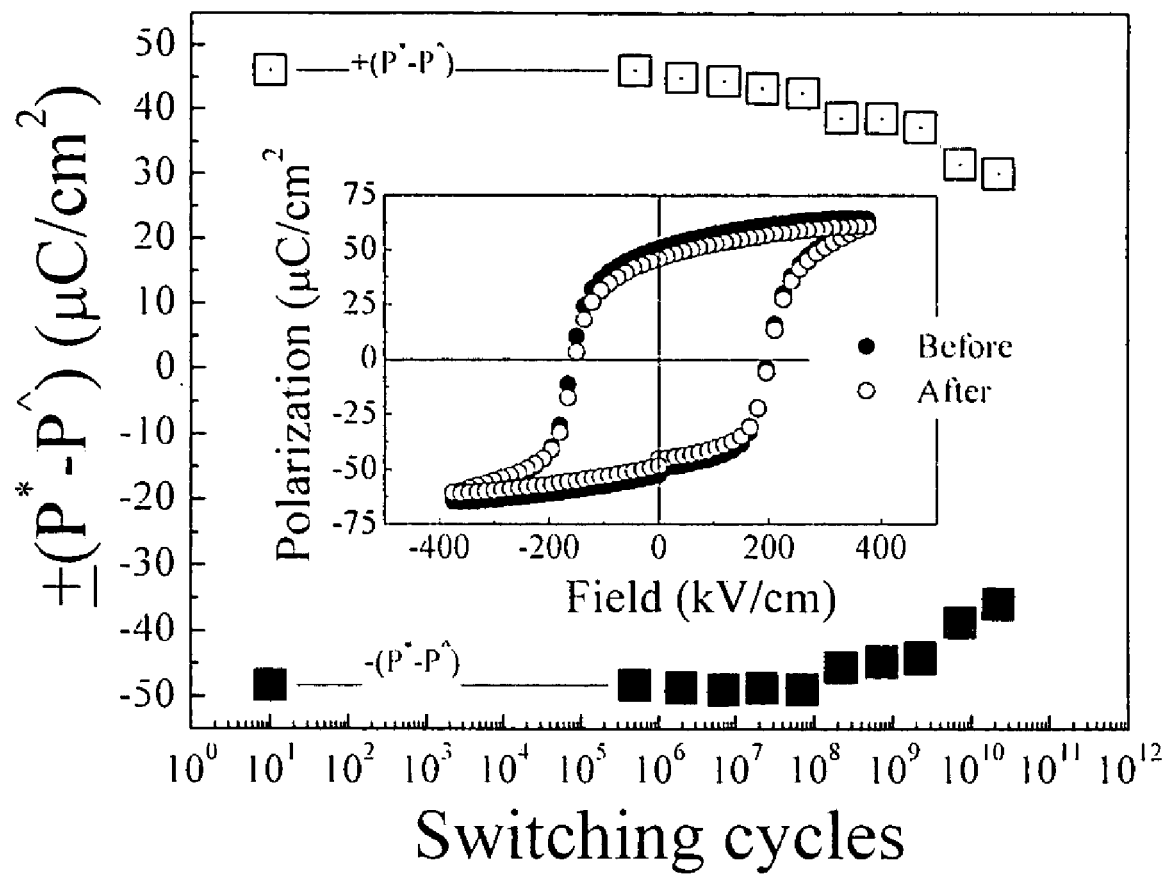
FIG. 5 is a graph of the polarization fatigue characteristics of the SBN thin film annealed at 750° C.

Fatigue testing of SBN thin films has been performed by applying bipolar pulses at 500 kHz with an amplitude of 400 kV/cm. The fatigue behavior of SBN thin films annealed at 750° C. is shown in FIG. 5. The percentage decay of switching polarization minus non-switchable polarization (P*−P^) in SBN thin films was about 21% after $10^{10}$ switching cycles, making it well suited for ferroelectric devices.

Although the invention has been described with specific preferred methods of fabrication, those skilled in the art will appreciate that many modifications and variations may be made without departing from the scope of the invention. All such modifications and variations are intended to be encompassed within the scope of the following claims.

We claim:

1. A laminate especially suitable for use in a memory comprising:
   a platinum-coated silicon substrate; and
   a layer of $SrBi_2Nb_2O_9$ on the platinum-coated silicon substrate, wherein the layer has a maximum remnant polarization of at least 30 $\mu C/cm^2$.

2. The laminate of claim 1, wherein the platinum-coated silicon substrate comprises a $Pt/TiO_2/SiO_2/Si$-layered substrate.

3. The laminate of claim 1, wherein the layer of $SrBi_2Nb_2O_9$ is deposited on the platinum-coated silicon substrate by pulsed laser deposition.

4. The laminate of claim 1, wherein the layer has a maximum remnant polarization of at least 40 $\mu C/cm^2$.

5. The laminate of claim 1, wherein the layer has a maximum remnant polarization of at least approximately 50 $\mu C/cm^2$.

6. A method of fabricating a thin film having a high remnant polarization, wherein the method comprises:
   providing a platinum-coated silicon substrate; and
   depositing a layer of $SrBi_2Nb_2O_9$ on the platinum-coated silicon substrate to form the thin film, wherein the thin film has a maximum remnant polarization of at least 30 $\mu C/cm^2$.

7. The method of claim 6, wherein the step of providing the platinum-coated silicon substrate comprises providing a $Pt/TiO_2/SiO_2/Si$-layered substrate.

8. The method of claim 7, wherein the step of depositing the layer of $SrBi_2Nb_2O_9$ comprises depositing the layer on the platinum-coated silicon substrate by pulsed laser deposition.

9. The method of claim 8, wherein the pulsed laser deposition generates a plume having a center axis and wherein the $Pt/TiO_2/SiO_2/Si$-layered substrate is positioned off the center axis.

10. The method of claim 6, wherein the thin film has a maximum remnant polarization of at least 40 $\mu C/cm^2$.

11. The method of claim 6, wherein the thin film has a maximum remnant polarization of at least approximately 50 $\mu C/cm^2$.

12. The method of claim 6, wherein in the step of depositing the layer of $SrBi_2Nb_2O_9$ the platinum-coated silicon substrate is held at approximately 350° C.

13. The method of claim 6, further comprising the step of annealing the thin film at approximately 750° C.

* * * * *